United States Patent [19]

Tokumitsu

[11] Patent Number: 5,546,056
[45] Date of Patent: Aug. 13, 1996

[54] INJECTION-LOCKED OSCILLATOR HAVING NON-RECIPROCAL FOUR PORT NETWORK

[75] Inventor: Tsuneo Tokumitsu, Kanagawa, Japan

[73] Assignee: Nippon Telegraph and Telephone Corporation, Tokyo, Japan

[21] Appl. No.: 378,952

[22] Filed: Jan. 27, 1995

[30] Foreign Application Priority Data

Jan. 28, 1994 [JP] Japan ..................... 6-024908

[51] Int. Cl.⁶ ................. H03B 5/00; H03B 5/24
[52] U.S. Cl. ............... 331/172; 331/55; 331/96; 331/108 B; 331/136
[58] Field of Search ................. 331/34, 46–48, 331/50–56, 96, 99, 117 D, 107 DP, 107 P, 107 SC, 108 B, 135–137, 172, 173, 108 C; 333/1, 1.1, 24.1, 24.2, 109, 112

[56] References Cited

U.S. PATENT DOCUMENTS 4,562,412  12/1985  Sugawara et al. ............. 331/53

FOREIGN PATENT DOCUMENTS 59-161925  9/1984  Japan .

OTHER PUBLICATIONS

IEEE Transactions on Microwave Theory and Techniques, vol. 37, No. 12, Dec. 1989, "Very Small Ultra–Wide–Band MMIC Magic T and Applications to Combiners and Dividers" Tokumitsu, et al., pp. 1985–1990.

"A 16 Element Quasi–Optical FET Oscillator Power Combining Array with External Injection Locking", Birkeland et al, *IEEE Transactions on Microwave Theory and Techniques*, vol. 40, No. 3, Mar. 1992, pp. 475–481.

"Two–Port FET Oscillators with Applications to Active Arrays", Birkeland et al., *IEEE Microwave and Guided Wave Letters*, vol. 1, No. 5, May 1991, pp. 112–113.

"Very Small Ultra–Wide–Band MMIC Magic T and Applications to Combiners and Dividers", Tokumitsu et al, *IEEE Transactions on Microwave Theory and and Techniques*, vol. 37, No. 12, Dec. 1989, pp. 1985–1990.

*Primary Examiner*—David Mis
*Attorney, Agent, or Firm*—Nikaido, Marmelstein, Murray & Oram LLP

[57] ABSTRACT

An injection-locked oscillator having a non-reciprocal four-port network with a pair of input ports (1, 2) and a pair of output ports (3, 4) in which the signal transfer path from a first input port (1) to a first output port (3) is non-reciprocal, the signal transfer path from a second input port (2) to a second output port (4) is non-reciprocal, the signal transfer path from a second input port (2) to a first output port (3) is non-reciprocal, and an amplifier with the input port coupled with said first output port and the output port coupled with said second input port, is locked to an injection signal applied to said first input port and provides oscillation output to said second output port (4). The circuit between the first input port (1) and the second input port (2), and the circuit between the first output port (3) and the second output port (4) are isolated. The present oscillator is implemented in a small IC chip, and has feature to be injection-locked in wide frequency band.

7 Claims, 6 Drawing Sheets

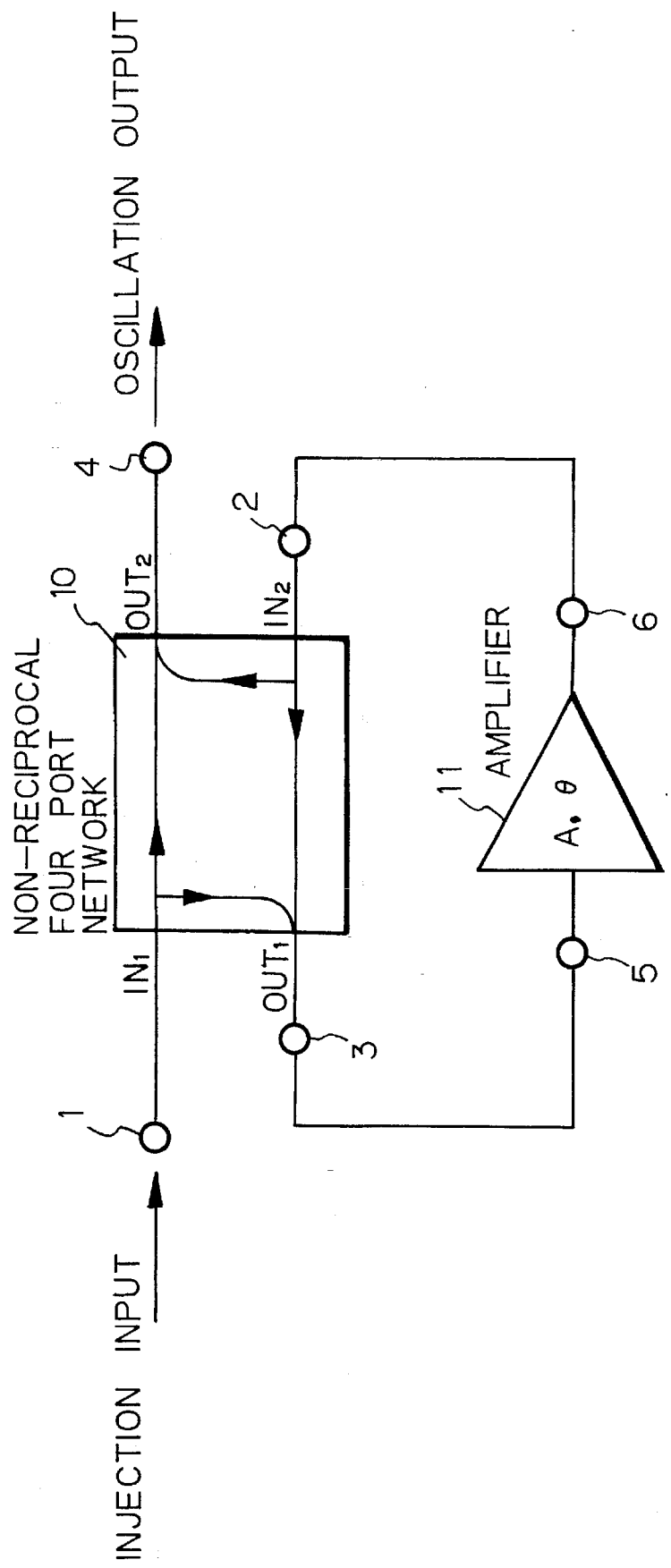

INJECTION-LOCKED OSCILLATOR HAVING NON-RECIPROCAL FOUR PORT NETWORK

BACKGROUND OF THE INVENTION

The present invention relates to an injection-locked oscillator which operates in microwave band, in particular, relates to such an oscillator which is suitable for fabricating the same in an integrated circuit.

An injection-locked oscillator is defined as an oscillator which oscillates with frequency $f_0$ in free running condition, and is locked or synchronized to frequency $f_1$ when an external injection signal of frequency $f_1$ is injected. An injection-locked oscillator is also a frequency multiplier, since the oscillator is locked with high stability and low phase noise oscillation, when a subharmonic frequency which is 1/n, n is an integer, of the free running oscillation frequency is injected.

The operational principle of an injection-locked oscillator is now described.

When an external injection signal is applied to an oscillator circuit which is in free running oscillation condition with frequency $f_0$, the circuit generates a beat of frequency of difference between the free running oscillation frequency and the external injection signal frequency, and the beat frequency goes to zero so that the free running frequency is locked to the injection frequency. The injection-locking bandwidth $\Delta f$ of an injection-locked oscillator is given as follows.

$$\Delta f = (f_0/Q_e)\sqrt{P_i/P_0}$$

where $f_0$ is free running oscillation frequency of an oscillator, $Q_e$ is an external Q of the oscillator, $P_0$ is oscillation output, $P_i$ is power of injection signal. As the value $Q_e$ is smaller and the value $P_i$ is larger, the injection-locking bandwidth is larger. For instance, when $P_i:P_0=1:10$, $Q_e=1$, and $f_0=5$ GHz, then, $\Delta f=1580$ MHz, and the frequency stability and the phase noise of an oscillation output are similar to those of an injection signal. The injection locking is also possible when a subharmonic frequency signal ($=f_0/n$, n is an integer) is injected to an oscillator, since an oscillator generates harmonic components of frequency $f_0$ because of non-linear characteristics of the oscillator.

FIG. 6 shows a prior basic injection-locked oscillator, in which a circulator 101 has an oscillation circuit 105 at the first port 102, and the second port 103 for providing an output signal, and the third port 104 for accepting an external injection signal. The arrow in the figure shows the direction of signal flow in the circulator, and the non-reciprocal directivity of the circulator provides an isolation among ports. Oscillator 105 may be implemented by a resonant structure with a negative impedance diode located at a predetermined length from a short circuited plane of a waveguide, or a combination of a strip line used for a resonator.

FIG. 7 shows another prior injection-locked oscillator which is combination of a directional coupler and an amplifier. An injection signal is applied to the first port 112 of the directional coupler 111, and an amplifier 116 is connected between the second port 113 (through port) and the third port 115 (isolation port) of the directional coupler 111. An oscillation output is provided at the fourth port 114 (coupled port) of the directional coupler 111. Solid arrows and dotted arrows in the figure show signal directions viewing at ports 112, and 115, respectively. A directional coupler is not non-reciprocal.

Ports 113 and 115 are connected to amplifier 116 for providing an external feedback loop for amplifier 116. When the phase shift in the feedback loop is 360° at a frequency where the amplifier provides a gain higher than the coupling coefficient, the circuit oscillates at that frequency. When an external signal is applied to port 112, a part of the signal is provided to the amplifier through port 113 so that the oscillation frequency is locked to the injection signal frequency. The oscillation output appears at port 114, but does not appear at port 112 which is an isolation port viewing from the amplifier output.

However, the circuit shown in FIG. 7 has a disadvantage that the operation of the circuit is influenced by an external circuit because the directional coupler is not non-reciprocal between ports 114 and 115.

In a subharmonically injection-locked oscillator, a filter circuit was conventionally used to separate the oscillation frequency path from the signal injection port 112.

A prior injection-locked oscillator employs a non-reciprocal circulator, or a directional coupler to separate an injection port from an oscillation circuit. Therefore, it has a disadvantage which restricts the operation frequency band due to diameter and/or thickness of the ferrite disc, and/or the quarter wavelength lines. The operation frequency band in a prior art is less than 10–50% of the center frequency. Therefore, the locking to a subharmonic frequency (which is f/n, f is oscillation frequency, and n=2, 3, 4 et al) is very difficult, or even if it is possible, a circuit operation is out of design due to the presence of complicated elements in a non-reciprocal circuit.

Further, a circuit using a circulator is impossible to be implemented the same in an integrated circuit, because of the use of a ferrite component.

A circuit using a directional coupler is too large in size to be implemented as an integrated circuit at frequencies less than 10 GHz because size of the directional coupler is anti-proportional to frequency. Further, a directional coupler type injection-locked oscillator has a disadvantage that it is influenced by an external circuit, because the oscillation loop is not electrically isolated from an injection signal input and/or an oscillation output.

A prior injection-locked oscillator which is locked to subharmonic frequencies has a filter circuit for isolating a signal injection port from an oscillation frequency paths, and therefore, it has the disadvantage that a subharmonic coefficient n must be restricted, and further it is impossible to lock to the fundamental frequency (n=1).

SUMMARY OF THE INVENTION

It is an object, therefore, of the present invention to overcome the disadvantages and limitations of a prior injection-locked oscillator by providing a new and improved injection-locked oscillator.

It is also an object of the present invention to provide an injection-locked oscillator which is implemented only mainly with a semiconductor element, but has no quarter wavelength circuit, and no ferrite circuit.

It is also an object of the present invention to provide an injection-locked oscillator which is not influenced by an external circuit, and operating in wide frequency band.

The above and other objects are attained by an injection-locked oscillator comprising; a non-reciprocal four-port network having a first and a second input ports and a first and a second output ports so that signal transfer path from the first input port to the first output port is non-reciprocal, signal transfer path from the second input port to the second output port is non-reciprocal, and signal transfer path from the second input port to the first output port is non-reciprocal, and circuits between the first input port and the second input port and between the first output port and the second output port are isolated; an amplifier with an input of the same coupled with said first output port and an output of the same coupled with said second input port, having operation frequency band in at least a part of operation frequency band of said four-port network; an injection signal input port coupled with said first input port of said four-port network; an oscillation output port coupled with said second output port of said four-port network.

BRIEF DESCRIPTION OF THE DRAWINGS

The foregoing and other objects, features, and attendant advantages of the present invention will be appreciated as the same become better understood by means of the following description and accompanying drawings wherein;

FIG. 1A is a basic diagram of an injection-locked oscillator according to the present invention.

DESCRIPTION OF THE PREFERRED EMBODIMENTS

Figure 1B:
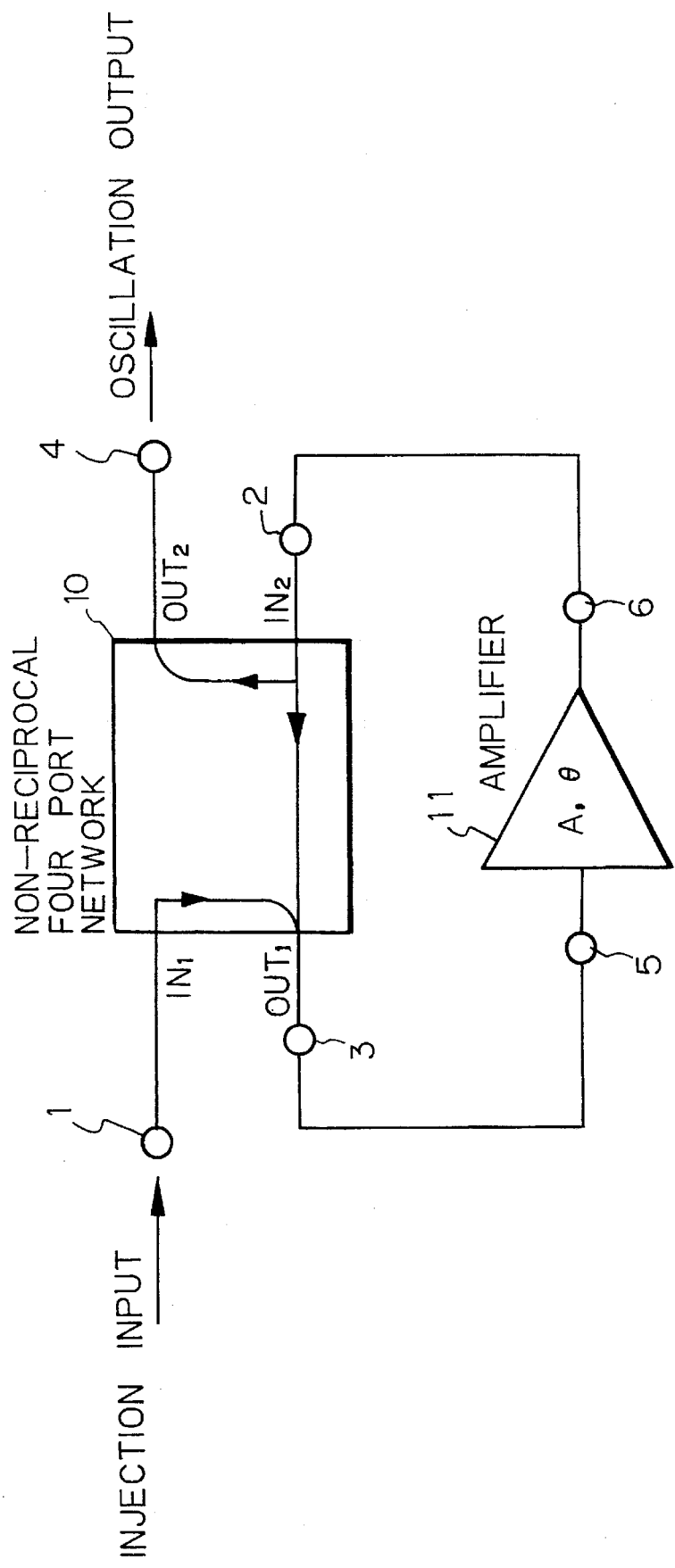
FIG. 1B is a modification of FIG. 1A.

FIG. 1A shows a basic circuit diagram of the injection locking oscillator according to the present invention. In the figure, numeral 10 is a non-reciprocal four-port network in which 1 is the first input port, 2 is the second input port, 3 is the first output port, and 4 is the second output port. An input signal applied to the first input port 1 is output only to ports 3 and 4, but a signal on port 3 or 4 can not go to port 1. In other words, signal transfer path from the first input port 1 to the first output port 3 is non-reciprocal, signal transfer path from the first input port 1 to the second output port 4 is non-reciprocal. Similarly, signal transfer path from the second input port 2 to the second output port 4 is non-reciprocal, and signal transfer path from the second input port 2 to the first output port 3 is non-reciprocal. The path between ports 1 and 2, and the path between ports 3 and 4 are isolated, and there is no signal transmission between those ports. The arrows in the figure show direction of signal. Numeral 11 shows an amplifier having voltage gain A, and phase shift θ, having an input port 5 and an output port 6. Said amplifier 11 may be substituted with an amplifier having voltage gain A and a delay circuit having phase shift θ. Input port 5 of the amplifier 11 is coupled with port 3 of the four-port network, and output port 6 of amplifier 11 is coupled with port 2 of the four-port network 10.

Figure 2:
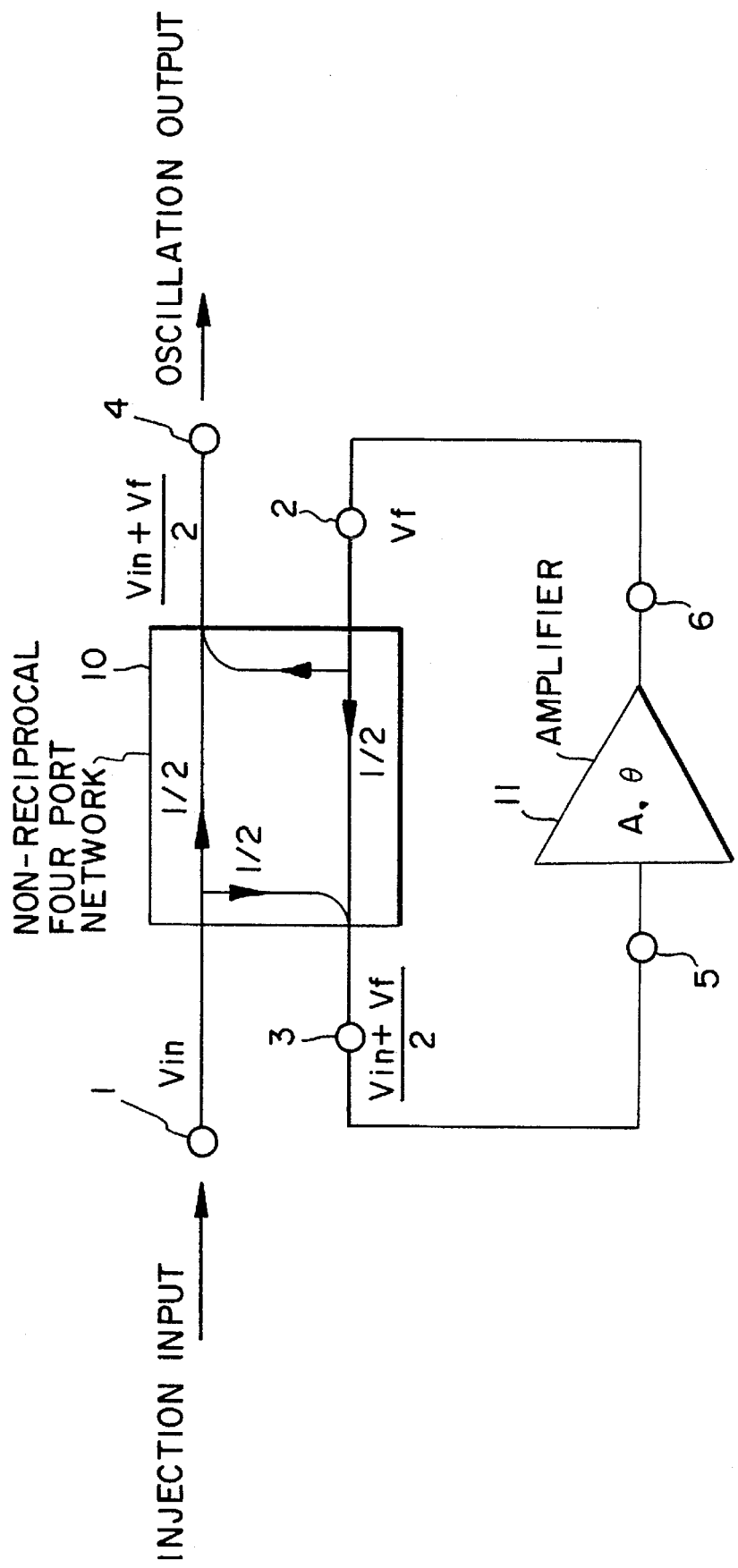
FIG. 2 is a basic diagram of an injection-locked oscillator according to the present invention.

Assuming that an input signal at port 1 or 2 is shared to ports 3 and 4 with a voltage ratio of ½, and the same phase, then, FIG. 1A is converted to FIG. 2, in which $V_{in}$ is input signal voltage, and $V_f$ is output of an amplifier. An output voltage $V_{out}$ is expressed as follows.

$$V_{out} = (V_{in} + V_f)/2 = V_{in}/(2 - Ae^{-j\theta}) = \frac{V_{in}}{\sqrt{(2-A\cos\theta)^2 + (A\sin\theta)^2}} \angle \tan^{-1}[(A\sin\theta)/(2-A\cos\theta)]$$

When the ratio $V_{out}/V_{in}$ is infinite the loop 2-3-5-6 oscillates, and the followings are satisfied.

2−Acosθ=0
Asinθ=0

Therefore, A=2, θ=0, or π(pi) or 2π, , , . In other words, when an amplifier and/or a delay circuit is designed so that A is larger than 2, and θ is an integer multiple of π(pi), the loop 2-3-4-5-2 is initiated for oscillation, and as the oscillation level increases, the gain A of the amplifier is suppressed, so that the oscillation is stabilized at A=2.

Provided that the four-port network 10 operates as mentioned above at any frequencies, when an input signal with high stability and low phase noise is applied to the input port 1, half of said input signal is applied to amplifier 11 through port 3, and harmonics are generated in the amplifier 11 due to non-linearity of the amplifier under oscillation. Provided that frequency of said harmonics are close to the oscillation frequency, beat is generated between said harmonics and the oscillation frequency. And then, the circuit conditions shift so that said beat frequency converges to zero, so that the oscillation frequency is locked to the injection frequency.

An oscillation output appears at the output port 4 through port 2, and does not appear at the input port 1 because of the non-reciprocity of the four-port network. Therefore, even when no impedance matching is satisfied at the port 1, no part of the oscillation output is reflected at the input port 1, and is injected to the oscillation loop again. Similarly, reflection signal at the output port 4 appears at no port, and therefore, it is not injected into the oscillation loop again. In other words, the circuit of FIG. 2 is not affected by an external circuit.

It should be appreciated that the non-reciprocal four-port network 10 may be implemented by the combination of four non-reciprocal amplifiers each located at the portion indicated by an arrow in the figure. In that case, the gain of each amplifier is not necessarily higher than 1, but an amplifier with gain less than 1 would be enough.

FIG. 1B shows a modification of FIG. 1A. The feature of FIG. 1B is that no non-reciprocal signal path from the first input port 1 to the second output port 2 is provided. That signal transfer path from port 1 to port 2 is not necessary for the operation of an injection locked oscillator. When a four-port network 10 is implemented by a co-planar circuit, the circuit may be symmetrical if a signal transfer path from port 1 to 3 exists, and therefore, operational frequency range would be wide.

Figure 3:
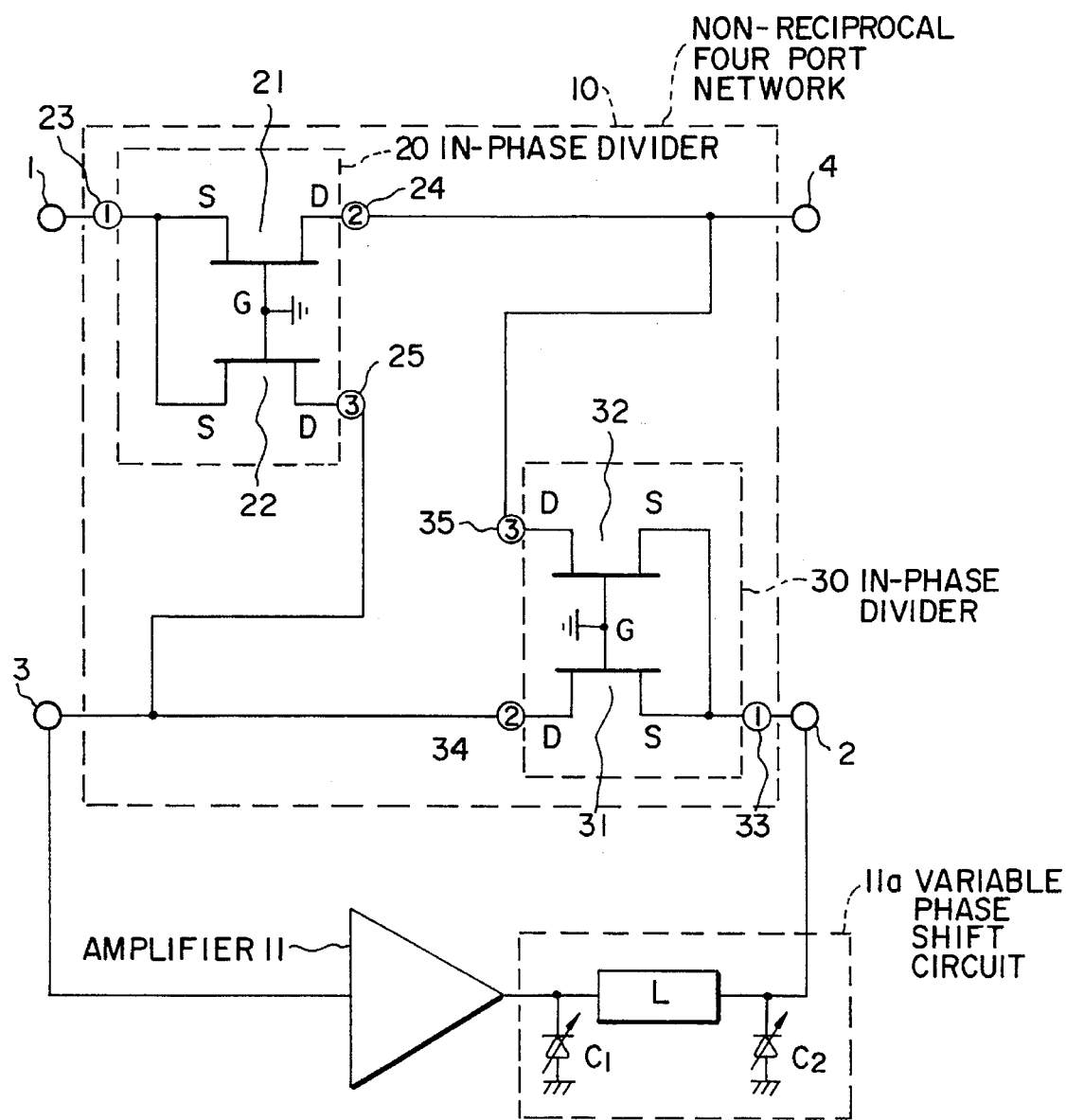
FIG. 3 is a circuit diagram of an injection-locked oscillator implemented by field effect transistors according to the present invention.

The embodiment which satisfies non-reciprocity of the four-port network at any frequencies is described in accordance with FIG. 3.

In an injection locked oscillator in FIG. 3, the numerals 21, 22, 31, and 32 are a common-gate field effect transistor (FET). Numerals 20 and 30 are a in-phase divider having a pair of said FET's. The same numerals in FIG. 3 as those in FIG. 2 show the same members. When a transistor is a field effect transistor, S indicates a source, D is a drain, and G is a gate.

Numeral 11 is an amplifier, and 11a is a variable phase shifter circuit having a line L, and a pair of variable capacitors $C_1$ and $C_2$. The phase shift circuit 11a adjusts free running frequency of the oscillator by controlling the capacitance of the capacitors $C_1$ and $C_2$.

An in-phase divider 20 and 30 operate as follows.

Assuming that the mutual conductance of an FET is gm, the reflection coefficient $S_{11}$ of the in-phase divider at the input port 23 (or 33) is;

$$S_{11} = (1 - 2 \, gm \, Z_0)/(1 + 2 \, gm \, Z_0)$$

The value $S_{11}$ is zero when $gm = 1/(2Z_0)$, where $Z_0$ is the system impedance for the circuit, and the impedance matching at port 23 (or 33) is satisfied. An input signal applied to port 23 (or 33) is divided to the output ports 24 and 25 (or 34 and 35) with the same phase, because of the symmetry of the circuit. The signal transfer ratios $S_{21}$ and $S_{31}$ from port 23 (or 33) to ports 24 and 25 (or 34 and 35) is as follow.

$$S_{21} = S_{31} = 2 \, gm \, Z_0/(1 + 2 \, gmZ_0)$$

Said value $S_{21}$ is ½ when port 23(or 33) is in impedance matching condition. On the other hand, the signal transfer from ports 24 and 25 (or 34 and 35) to port 23 (or 33) is prevented because of the non-reciprocity of an FET, and therefore, the signal transfer between the output ports 24 and 25 (or 34 and 35) is prevented.

That is to say, $S_{12} = S_{13} = 0$ is satisfied. Further, the non-reciprocal four-port network 10 having the power divider circuits 20 and 30 satisfies $S_{11}$, $S_{12}$, and $S_{13}$ are less than –20 dB in the frequency range from DC to 18 GHz, as shown in the article "Very Small Ultra-Wide-Band MMIC Magic T and Applicatoins to combiners and Dividers" (T. Tokumitsu et al., IEEE Trans., vol. MTT-37, No. 12, 1989). Since the cut-off frequency of an FET used is 20–23 GHz, said non-reciprocal four-port network, and/or the divider circuits, operates up to the cut-off frequency of a transistor element itself.

Said non-reciprocal four-port network is also implemented by using differential amplifiers, JP patent laid open 158008/1991, and JP patent laid open 58902/1990), with the similar operation as mentioned above.

As mentioned above, in a four-port circuit 10, signals at ports 24 and 25 (or 34 and 35) are forwarded to ports 4 and 3 (or 3 and 4), respectively, but a signal from port 4 (or 3) to port 1(or 2), 2(or 1), 3(or 4) is prevented because of non-reciprocity of the circuit. Further, since output impedance of each divider circuit is very high, ports 3 and 4 receive the signal itself divided by a divider. Therefore, the signal paths indicated in the four-port network 10 in FIGS. 1 and 2 is satisfied at any frequencies at wide frequency band. The combination of said four-port network and an amplifier 11 as shown in FIG. 3 provides an injection locked oscillator which is locked to the fundamental basic frequency (n=1), and subharmonic frequencies (n=2, 3, 4 et al).

The distribution ratio of a divider is assumed to be 1:1 in the above explanation, but it should be appreciated that another ratio is of course possible so long as the gain in the loop 2-3-5-6-2 is higher than 1.

Further, it should be appreciated that the path from port 1 to port 4 installed in a four-port network is not necessary in the operation of the present injection-locked oscillator, although the presence of said path is no harm to the operation.

It should be noted that the present injection-locked oscillator is implemented by using only a transistor circuit, but no distribution constant circuit such as a quarter wavelength line is used. Therefore, the present oscillator is implemented on a single chip and packed in a small package along with semiconductor IC, or a microwave IC with small size, that is a frequency converter. As a commercial miniature package is enough for implementing the oscillator module, the producing cost may be low.

Since the present oscillator may be locked to frequency within the operation frequency band of an amplifier and/or 1/n of that frequency, to provide high stability and low phase noise signal. Therefore, the selection for an injection signal generator is arbitrary. When an injection signal generator IC is implemented for instance by a synthesizer for mobile communication, the present oscillator module is implemented by only two IC chips. Therefore, the present oscillator is simple and economical as compared with a prior PLL circuit which has many package IC's including a voltage controlled oscillator, a power divider circuit, a frequency divider, a phase comparator, and a low-pass filter.

Figure 4:
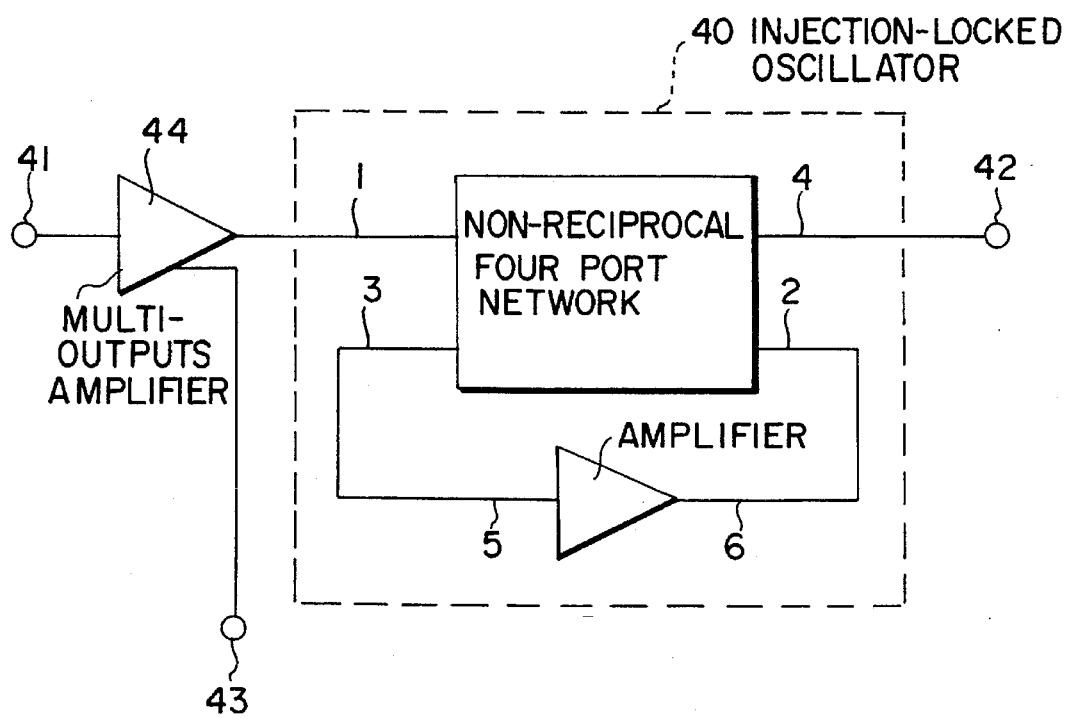
FIG. 4 is another embodiment having an injection signal separator according to the present invention.

FIG. 4 shows another embodiment of the present injection-locked oscillator. In the figure, numeral 40 is an injection-locked oscillator mentioned in the previous embodiment, 44 is a multi-outputs amplifier having one input port and two output ports, 41 is an injection signal input port, 42 is an oscillation output port, 43 is a second output port of an amplifier 44.

The embodiment of FIG. 4 has the feature of the presence of amplifier 44, so that level of an input signal at an port 41 can be low. Further, since amplifier 44 provides an output signal at a port 43 with amplified high level, said output signal at 43 is used as an injection input signal for a succeeding injection-locked oscillator which is locked with no deterioration of injection-locking bandwidth. Therefore, a plurality of injection-locked oscillators may be locked with a common injection input signal. Conventionally, when a plurality of injection-locked oscillators are locked with a single injection input signal, a parallel multi-divider having a Willkinson divider is used for dividing an input signal, and therefore, the whole apparatuses must be located on a secondary dimensional plane. On the other hand, according to the present invention, since an injection input signal is located on a linear line, a plurality of injection-locked oscillators may be arranged either linearly, or secondary dimensional plane or third dimensional space. Further, since the path between an input port and output ports, and the path between output ports of a multi-output amplifier are isolated, each injection oscillator operates independently from another injection-locked oscillator. Further, since the operation frequency of a multi-output amplifier 44 is only 1/n of that of an injection-locked oscillator 40, operation frequency of said amplifier 44 and its related circuit may be low.

Figure 5:
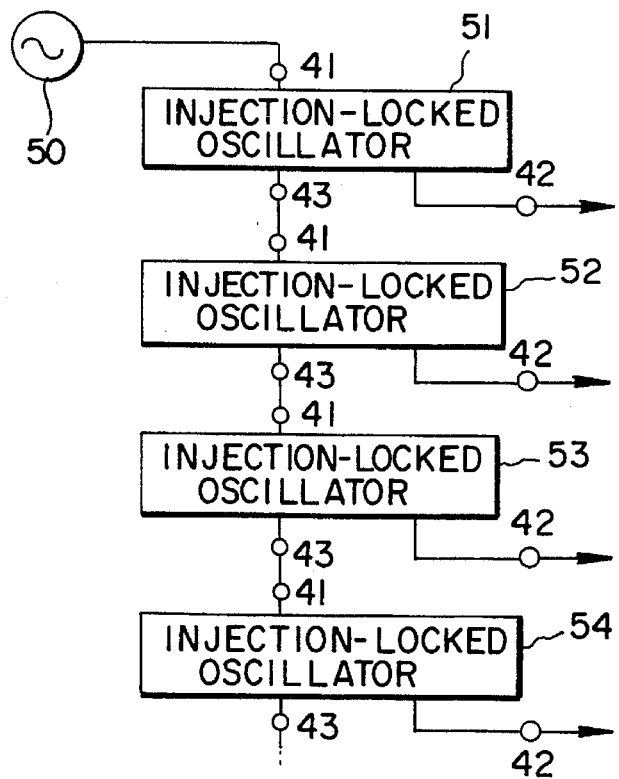
FIG. 5 is still another embodiment having a plurality of injection-locked oscillators.
Figure 6:
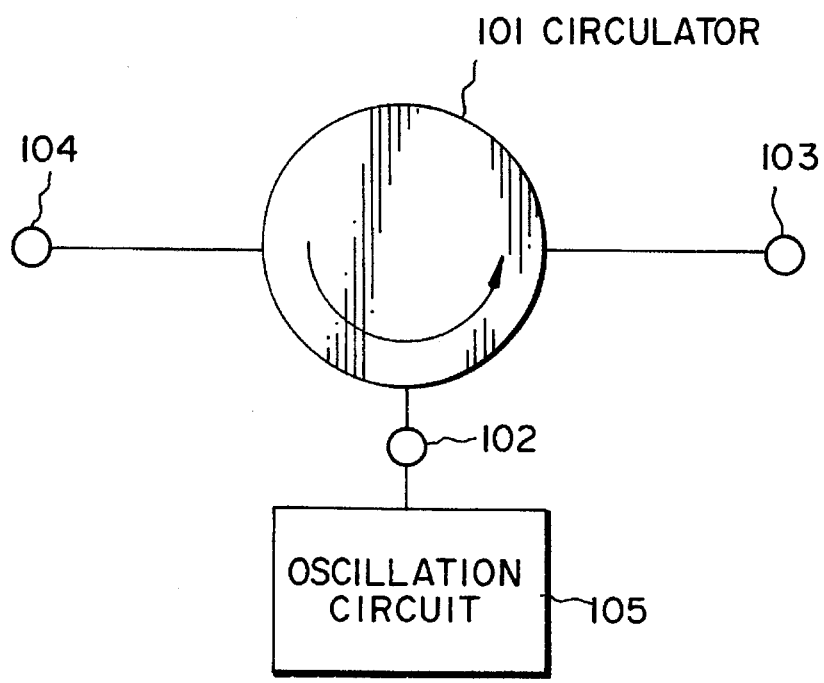
FIG. 6 is a prior injection-locked oscillator implemented by using a circulator.
Figure 7:
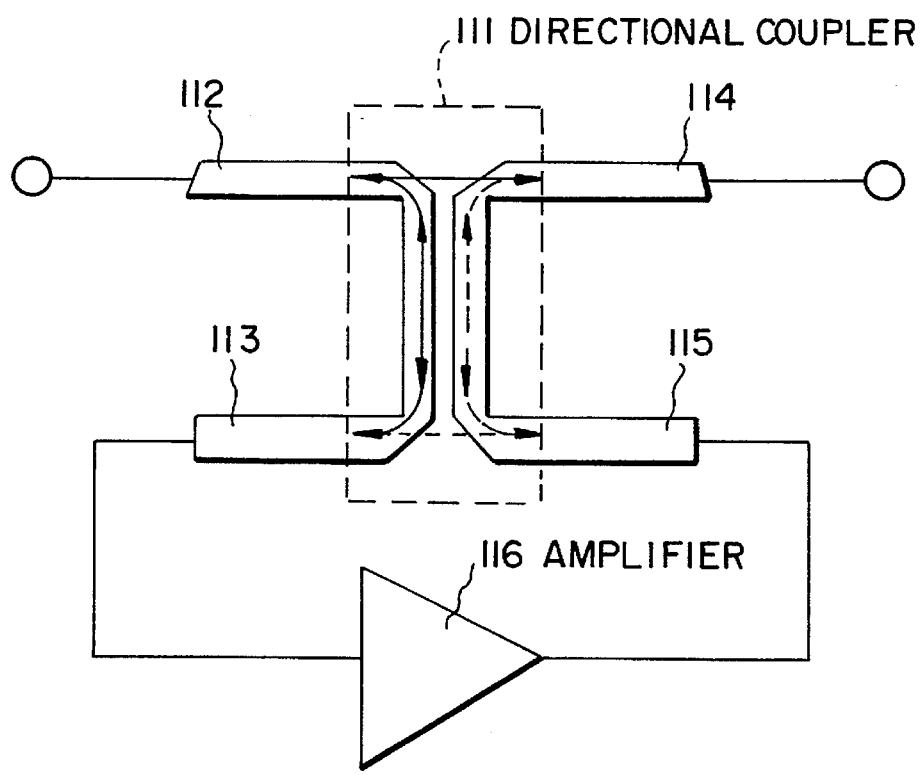
FIG. 7 is another prior injection-locked oscillator implemented by using a directional coupler.

FIG. 5 shows an embodiment in which a plurality of injection-locked oscillators are arranged linearly. The same numerals as those in FIG. 4 show the same members. Numeral 50 is a common injection source, which applies an injection signal with high stability and low phase noise to a first injection-locked oscillator 51 which has the structure of FIG. 4. The first oscillator 51 provides not only a locked output at the output port 42, but also the second output for injection input signal for a succeeding oscillator 52 at port 43. Thus, the second injection-locked oscillator 52 is locked with an injection input which is provided at port 43 of the first oscillator 51. Similarly, the succeeding oscillators 53, 54 et al are locked to a common injection source 50. The structure of FIG. 5 may be used in any point between injection-locked oscillators, and therefore, no severe condition for arrangement such as a prior parallel multi-divider circuit is necessary.

Further, a suitable phase shifter, or a delay line between adjacent injection-locked oscillators (between ports 43 and 41) provide desirable phase relations between oscillation output signals. Further, phase shifters or delay lines having suitable phase shift or delay time provide the various phases in the output signals. That allows to feed an array antenna.

In the modification of the above embodiments, it is not restricted to a field effect transistor, but a bipolar transistor is possible. Also, it is not restricted to a common gate FET, but other type (drain-grounded or source-grounded) is possible. When it is a source-grounded, since a divider circuits 20 or 30 has gain, it is not necessary that an amplifier 11 must have gain higher than 1.

As mentioned above, the present invention has a non-reciprocal four-port network having a pair of input ports and a pair of output ports so that the signal transfers from a first input port to a first output port, from a second input port to a first output port and from a second input port to a second output port are non-reciprocal, and the circuits between a first input port and a second input port and between a first output port and a second output port are isolated, and an amplifier with operation frequency band which is a part of operation frequency band of said four-port network. Said amplifier is couple between a first output port of said four-port network and a second input port of said four-port network. A first input port of the four-port network is an input port of an injection-locked oscillator, and a second output port of the four-port network is an output port of said oscillator. A multi-output amplifier may be inserted between an input port of the oscillator and a first input port of the four-port network.

The present oscillator is implemented only by using transistors, or at least a main component is a transistor. Therefore, no quarter wavelength circuit which is bulk and/or no circuit having ferrite is necessary, so that the present oscillator is packed into a small IC chip. Because of the non-reciprocity of a four-port network, an oscillation loop (2-3-5-6-2), an injection signal input, and an oscillation output are isolated with one another. Therefore, the present oscillator is not affected by an external circuit, and/or an external load. Further, the present oscillator has very wide operation frequency band because of the wide operation frequency band of a transistor so that the oscillator may be locked to an injection signal of wide frequency band, and subharmonic coefficient n may be designed arbitrary.

Therefore, a local oscillator in a transmitter and/or a receiver may be obtained by combining the present oscillator with a commercially obtained synthesizer.

Further, since an injection signal is amplified so that it is injected to a succeeding oscillator with no attenuation of an injection signal, a plurality of oscillators may be locked to a common injection signal without restricting operation band of synchronization. Further, the present invention is applicable to feed an array antenna by inserting a phase shifter between adjacent oscillators. Since the oscillators may be located either linearly, or in secondary dimensional plane, or in third dimensional space, the freedom of beam formation of an array antenna is improved.

Since an amplifier is provided in a loop for free running oscillation, the loop gain may be controlled either higher than 1 or lower than 1 by adjusting the gain of said amplifier, so that the oscillation is switched ON and OFF. That feature is applicable to frequency switching, and/or frequency hopping communication.

From the foregoing, it will now be apparent that a new and improved injection-locked oscillator has been found. It should be understood of course that the embodiments disclosed are merely illustrative and are not intended to limit the scope of the invention. Reference should be made to the appended claims, therefore, for indicating the scope of the invention.

What is claimed is:

1. An injection-locked oscillator comprising;

a non-reciprocal four-port network having a first and a second input ports and a first and a second output ports so that signal transfer path from the first input port to the first output port is non-reciprocal, signal transfer path from the second input port to the second output port is non-reciprocal and signal transfer path from the second input port to the first output port is non-reciprocal, and circuits between the first input port and the second input port and between the first output port and the second output port are isolated, an amplifier with an input of the same coupled with said first output port and an output of the same coupled with said second input port, having operation frequency band in at least a part of operation frequency band of said four-port network, an injection signal input port coupled with said first input port of said four-port network, an oscillation output port coupled with said second output port of said four-port network.

2. An injection-locked oscillator according to claim 1 further comprising a multi-output amplifier having a single input and a plurality of outputs is coupled between said injection signal input port and said first input port of said four-port network, so that one of said plurality of outputs of said multi-output amplifier is coupled with said insjection signal input port of related injection-locked oscillator.

3. An injection-locked oscillator according to claim 1, wherein a non-reciprocal signal transfer path is provided from said first input port to said second output port of said four-port network.

4. An injection-locked oscillator according to claim 1, wherein each signal transfer path in said four-port network has a non-reciprocal amplifier.

5. An injection-locked oscillator according to claim 4, wherein each of said non-reciprocal amplifiers have a field effect transistor with a gate grounded, and a source and a drain in each signal transfer path respectively.

6. An injection-locked oscillator according to claim 4, wherein a variable phase shift circuit is provided in series with said amplifier.

7. An injection-locked oscillator assembly comprising a plurality set of injection-locked oscillator and a multi-output oscillator, each of said injection-locked oscillator having a non-reciprocal four-port network with a pair of input ports and a pair of output ports so that signal transfer path from a first input port to a first output port is non-reciprocal, signal transfer path from a second input port to a second output port and a signal transfer path from a second input port to a second output port are non-reciprocal, and circuits between said first input port and said second input port and between said first output port and said second output port are isolated, an amplifier coupled between said first output port and said second input port, and an oscillation output port coupled with said second output port, an injection input port coupled with an input port of a first multi-output amplifier, a first output port of each multi-output amplifier being coupled with a first input port of a four-port network of an injection-locked oscillator in a same stage as that of the multi-output amplifier, and a second output port of each multi-output amplifier being coupled with an input port of a multi-output amplifier in a succeeding stage.

* * * * *